United States Patent [19]

Au Coin et al.

[11] 4,043,860

[45] Aug. 23, 1977

[54] METHOD OF GROWING SINGLE CRYSTALS OF NEODYMIUM PENTAPHOSPHATE

[75] Inventors: Thomas R. Au Coin, Ocean; Abraham Schwartz, Oakhurst; John G. Gualtieri, Oceanport; Melvin J. Wade, Howell, all of N.J.

[73] Assignee: The United States of America as represented by the Secretary of the Army, Washington, D.C.

[21] Appl. No.: 761,913

[22] Filed: Jan. 24, 1977

[51] Int. Cl.$^2$ .................. B01J 17/04; B01J 17/20; C01B 25/38; C01F 17/00
[52] U.S. Cl. .................. 156/624; 156/DIG. 63; 23/305 RE; 423/263; 423/305; 252/301.4 P
[58] Field of Search ............... 156/607, 621, 624, 623, 156/DIG. 3; 423/263, 305, 314; 23/305 RE, 301 R; 252/301.4 P, 301.1 L

[56] References Cited

U.S. PATENT DOCUMENTS

| | | | |
|---|---|---|---|
| 3,332,741 | 7/1967 | Teatum | 423/263 |
| 3,673,103 | 6/1972 | Awazu | 423/263 |
| 3,813,613 | 5/1974 | Danielmeyer | 423/263 |
| 4,002,725 | 1/1977 | Bridenbaugh | 423/263 |

OTHER PUBLICATIONS

Tofield et al., Mat. Res. Bull., vol. 9, pp. 435–448, 1974, "On the Growth of Neodymium Pentaphosphate Crystals...".
Miller et al., J. of Cryst. Growth, vol. 23, No. 4, Oct. 1974, pp. 313–317, "Growth of R.E. Pentaphosphates in Phosphoric Acid".
Danielmeyer et al., J. Of Cryst. Growth, vol. 22, 1974, pp. 298–302, "Growth of Laser Quality $NdP_5O_{14}$ Crystals".
Yamada et al., J. of App. Phys., vol. 45, No. 11, Nov. 1974, pp. 5096–5097, "Fluorescence of Li Nd Ultraphosphate Single Crystals".
Bayers, J. Inorg. Nucl. Chem., 1957, vol. 5, pp. 133–140, "Phosphates and Polyphosphates the R. E. Elements".

Primary Examiner—Stephen J. Emery
Attorney, Agent, or Firm—Nathan Edelberg; Jeremiah G. Murray; Roy E. Gordon

[57] ABSTRACT

Single crystals of neodymium pentaphosphate greater than one centimeter in size and of high purity and quality are grown from polyphosphoric acid solutions using the combination of a dilute solution, seeding, growth temperatures of 500° to 650° C, and a double crucible configuration.

12 Claims, No Drawings

METHOD OF GROWING SINGLE CRYSTALS OF NEODYMIUM PENTAPHOSPHATE

BACKGROUND OF THE INVENTION

This invention relates in general to a method of growing single crystals of neodymium pentaphosphate and in particular to such a method in which the resulting single crystals are greater than one centimeter in size and of high purity and quality.

The requirement for low-threshold high-efficiency laser sources for miniaturized rangefinder and fiber optic communication applications has led to the study of rare earth pentaphosphate compounds. Neodymium pentaphosphate (NdPP) has recently emerged as a promising 1.05μm laser material operating in pulsed and continuous wave modes, with thresholds of the latter reported less than one milliwatt. In contrast to doped lasers such as Nd:YAG, NdPP is a stoichiometric compound ($NdP_5O_{14}$) which accommodates up to thirty times more Nd than YAG.

Heretofore, NdPP has been prepared by a method generally involving addition of the rare earth oxide and diluent oxide (if wanted) to a crucible containing orthophosphoric acid at approximately 200° C. After the oxides are added, the crucible is covered and placed in a resistance furnace at temperatures to 600° C. After a period ranging from one to two weeks, the furnace is cooled and the crystals are extracted from the crucible by leaching the remaining polyphosphoric acid with hot water. This process has typically yielded hundreds of small crystals ranging from one to several millimeters in length. Because of their limited size and quality, these crystals cannot be used as NdPP lasers in certain prototype components such as rangefinders and target designators using transverse and longitudinal optical pumping.

SUMMARY OF THE INVENTION

The general object of this invention is to provide a method of growing single crystals of NdPP. A further object of the invention is to provide such a method that results in single crystals greater than 1 centimeter in size and of high purity and quality. A particular object of the invention is to provide such a method wherein the resulting single crystals can be used as lasers in prototype components using transverse and longitudinal optical pumping.

It has now been found that the foregoing objects can be attained by growing the single crystals of NdPP from polyphosphoric acid solutions using the combination of a dilute solution, seeding, growth temperatures of 500° to 650° C and a double crucible configuration.

DESCRIPTION OF THE PREFERRED EMBODIMENT

EXAMPLE 1

Orthophosphoric acid ($H_3PO_4$) containing 15% water is poured into a first or inner vitreous carbon crucible and the phosphoric acid induction heated to approximately 200° C to boil off some of the water. Neodymium oxide is then added to an excess of the hot acid in the ratio of 0.5 to 3.0 grams of oxide per 50 milliliters of orthophosphoric acid. The pentaphosphate is formed with the simultaneous evolution of water. The unreacted phosphoric acid containing the dissolved NdPP is then heated above 200° C to a temperature of about 350° C. The first crucible is then placed within a second or outer crucible that is larger than the first crucible, the second crucible containing about 15 milliliters of phosphoric acid and being made of vitreous carbon. A lid is placed over the first crucible and then a larger lid is placed over the second crucible. This double crucible configuration is then heated in a furnace at a temperature of about 500° C to 650° C for about 24 to 48 hours. The lids are then removed from the crucibles and several NdPP seed crystals added to the first crucible. The lids are then replaced over the crucibles and the furnace maintained at about 500° C to 650° C until maximum growth of the single crystals is obtained.

The single crystals are greater than 1 centimeter in size, of high optical purity and quality, and are characterized by a fluorescent lifetime of at least 100 microseconds.

In the aforedescribed growth procedure, the first and second crucibles must be highly resistant to acid attack and leak proof. This is because hot phosphoric acid is extremely corrosive and attacks even gold and platinum crucibles at the temperatures used for growth. Crucibles that have been found to have the required resistance are vitreous carbon, pyrolytic carbon coated carbon, and pyrolytic silicon carbide coated carbon crucibles. Of these materials, the use of vitreous carbon is preferred.

The use of the double crucible configuration is very important in the invention as it minimizes the loss of volatile components and thus controls the growth rate. Generally, a controlled and slow rate of evaporation at a given temperature yields the highest quality single crystals. The orthophosphoric acid in the outer crucible provides an acid/water saturated ambient surrounding the inner crucible. This greatly decreases the evaporation rate of volatile polyphosphoric acid components from the inner crucible. The addition of several seed crystals is found to greatly reduce the degree of supersaturation. The seed crystals are obtained by conventional methods of growth from polyphosphoric acid solution as stated in the background of the invention. This seeding step leads to at least a tenfold reduction in the number of nucleation sites formed, thus enhancing the growth of fewer but larger crystals.

The initial rare earth oxide to orthophosphoric acid ratios are also important in determining crystal size, yield, and perfection. That is, larger crystals of high quality are consistently grown from the more dilute solutions, 0.01 to 0.06 gram of rare earth oxide per milliliter of phosphoric acid. Concentrations above 0.06 gram of rare earth oxide per milliliter of orthophosphoric acid lead to a higher degree of supersaturation which promotes spontaneous nucleation of many small crystals containing numerous internal defects.

The fluorescence and laser properties of the NdPP single crystals grown according to the method of the invention can be modified by diluting the neodymium with varying amounts of an ion such as yttrium, cerium, gadolinium, lanthanum, indium, or bismuth. In all instances, the ion is added initially in its oxide form together with the neodymium oxide to the orthophosphoric acid. In this connection, a single crystal of NdPP 2.5 × 3.5 × 2.2mm thick grown according to the method of the invention and diluted with 10 percent yttrium produces 0.24 watts of output power for 1.0 watt of absorbed power using longitudinal pumping with a repetitively pulsed argon laser. The conversion efficiency is thus about 24 percent.

EXAMPLE 2

The method is the same as in the preferred embodiment except that the neodymium oxide is essentially replaced by lanthanum oxide with only a trace of neodymium oxide being used. The resulting single crystal has a fluorescent lifetime of about 300 microseconds.

EXAMPLE 3

The method is the same as in the preferred embodiment except that the NdPP is diluted with 90 mole percent of lanthanum. The fluorescent lifetime of the resulting single crystal is about 195 microseconds.

EXAMPLE 4

The method is the same as in the preferred embodiment except that the NdPP is diluted with 10 mole percent of lanthanum. The fluorescent lifetime of the resulting single crystal is about 110 microseconds.

EXAMPLE 5

The method is the same as in the preferred embodiment except that the NdPP is diluted with 90 mole percent of yttrium. The fluorescent lifetime of the resulting single crystals is about 220 microseconds.

EXAMPLE 6

The method is the same as in the preferred embodiment except that the NdPP is diluted with 10 mole percent of yttrium. The fluorescent lifetime of the resulting single crystal is about 120 microseconds.

EXAMPLE 7

The method is the same as in the preferred embodiment except that the NdPP is diluted with 90 mole percent gadolinium. The fluorescent lifetime of the resulting single crystal is about 260 microseconds.

EXAMPLE 8

The method is the same as in the preferred embodiment except that the NdPP is diluted with 90 mole percent of cerium. The fluorescent lifetime of the resulting single crystal is about 270 microseconds.

The method of the invention is also applicable to the growing of single crystals of other rare earth pentaphosphates such as the pentaphosphates of samarium, europium, terbium, dysprosium, and erbium.

Other modifications are seen as coming within the scope of the invention. For example, phosphoric acid can be eliminated from the second or outer crucible.

We wish it to be understood that we do not desire to be limited to the exact details as described, for obvious modifications will occur to a person skilled in the art.

What is claimed is:

1. Method of growing single crystals of neodymium pentaphosphate greater than 1 centimeter in size and of high purity and quality from polyphosphoric acid solutions, said method including the steps of
    A. heating orthophosphoric acid contained in a first crucible made of a material that is leakproof and highly resistant to acid attack to about 200° C,
    B. adding neodymium oxide to the acid in the ratio of 0.5 to 3.0 grams of oxide per 50 milliliters of orthophosphoric acid,
    C. increasing the temperature to a temperature of about 350° C,
    D. placing the first crucible in a second crucible, larger than the first crucible, said second crucible containing phosphoric acid and being made of a material that is leakproof and highly resistant to acid attack,
    E. placing lids over said first and second crucibles, and heating the double crucible configuration in a furnace at a temperature of about 500° C to 650° C for about 24 to 48 hours,
    F. removing the lids from said crucibles and adding several seed crystals to said first crucible, and
    G. replacing the lids on the crucibles and maintaining the furnace at about 500° C to 650° C until maximum growth of the single crystals are obtained.

2. Method according to claim 1 wherein the neodymium pentaphosphate is diluted with a cation selected from the group consisting of yttrium, indium, bismuth, gadolinium, cerium, and lanthanum.

3. Method according to claim 2 wherein the neodymium pentaphosphate is diluted with yttrium.

4. Method according to claim 2 wherein the neodymium pentaphosphate is diluted with indium.

5. Method according to claim 2 wherein the neodymium pentaphosphate is diluted with bismuth.

6. Method according to claim 2 wherein the neodymium pentaphosphate is diluted with gadolinium.

7. Method according to claim 2 wherein the neodymium pentaphosphate is diluted with cerium.

8. Method according to claim 2 wherein the neodymium pentaphosphate is diluted with lanthanum.

9. Method according to claim 1 wherein the crucible that is leakproof and highly resistant to acid attack is of a material selected from the group consisting of vitreous carbon, pyrolytic carbon coated carbon and pyrolytic silicon carbide coated carbon.

10. Method according to claim 9 wherein the material is vitreous carbon.

11. Method according to claim 9 wherein the material is pyrolytic carbon coated carbon.

12. Method according to claim 9 wherein the material is pyrolytic silicon carbide coated carbon.

* * * * *